(12) United States Patent
Hanada et al.

(10) Patent No.: US 6,518,657 B2
(45) Date of Patent: Feb. 11, 2003

(54) SEMICONDUCTOR DEVICE AND LEAD FRAME ASSEMBLY/LEAD FRAME FOR MAKING A SEMICONDUCTOR DEVICE

(75) Inventors: Hideshi Hanada, Fukuoka (JP); Jun Sugimoto, Fukuoka (JP); Yuichi Douki, Fukuoka (JP)

(73) Assignee: Mitsui High-tec Inc., Kitakyushu (JP)

( * ) Notice: Subject to any disclaimer, the term of this patent is extended or adjusted under 35 U.S.C. 154(b) by 0 days.

(21) Appl. No.: 09/878,637

(22) Filed: Jun. 11, 2001

(65) Prior Publication Data

US 2002/0047194 A1 Apr. 25, 2002

(30) Foreign Application Priority Data

Jun. 12, 2000 (JP) ........................................ 2000-175345

(51) Int. Cl.[7] ............................................. H01L 23/495
(52) U.S. Cl. ..................... 257/692; 257/666; 257/698; 257/710
(58) Field of Search ................ 174/52.4; 257/666, 257/692, 698, 706, 710, 712, 717; 357/68, 70, 72, 75

(56) References Cited

U.S. PATENT DOCUMENTS

| | | | | |
|---|---|---|---|---|
| 4,477,827 A | * | 10/1984 | Walker et al. | 257/670 |
| 4,714,952 A | * | 12/1987 | Takekawa et al. | 174/52.4 |
| 5,497,032 A | * | 3/1996 | Tsuji et al. | 257/678 |
| 6,133,623 A | * | 10/2000 | Otsuki et al. | 257/666 |
| 6,198,163 B1 | * | 3/2001 | Crowley et al. | 257/675 |
| 6,281,568 B1 | * | 8/2001 | Glenn et al. | 174/52.4 |
| 6,316,727 B1 | * | 11/2001 | Liu | 174/52.4 |
| 6,437,429 B1 | * | 8/2002 | Su et al. | 257/678 |

* cited by examiner

*Primary Examiner*—David Nelms
*Assistant Examiner*—Dao H. Nguyen
(74) *Attorney, Agent, or Firm*—Wood, Phillips, Katz, Clark & Mortimer

(57) ABSTRACT

A semiconductor device having oppositely facing first and second sides. The semiconductor device has a support exposed at the first side of the semiconductor device, a semiconductor device mounted on the support, and a plurality of leads connected to the semiconductor device. A lead identifier on the support is visible at the first side of the semiconductor device, and assists identification of a specific lead in the plurality of leads.

22 Claims, 4 Drawing Sheets

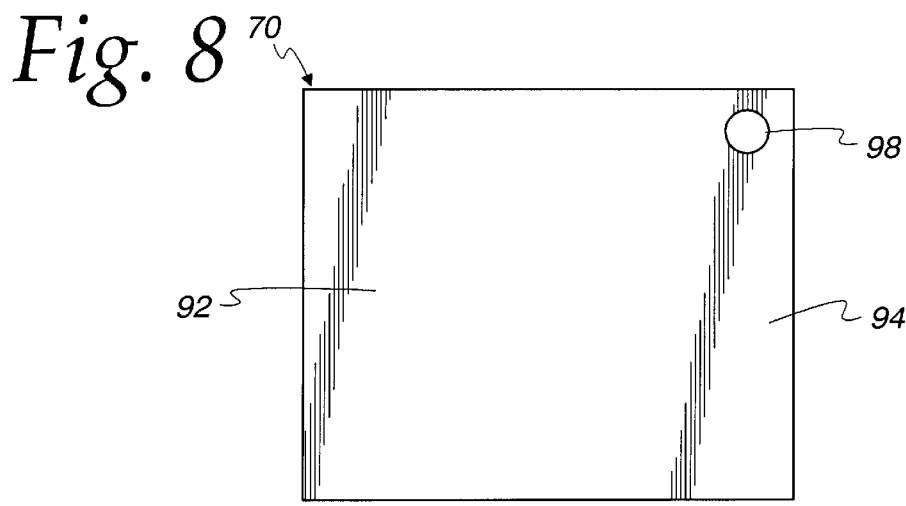
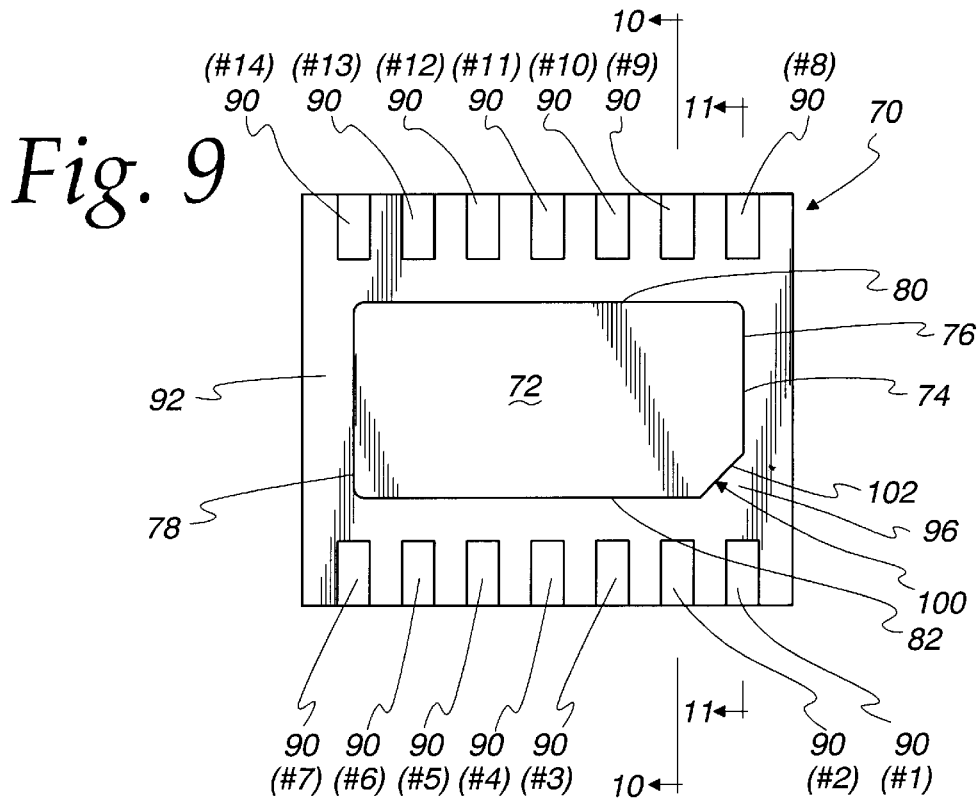
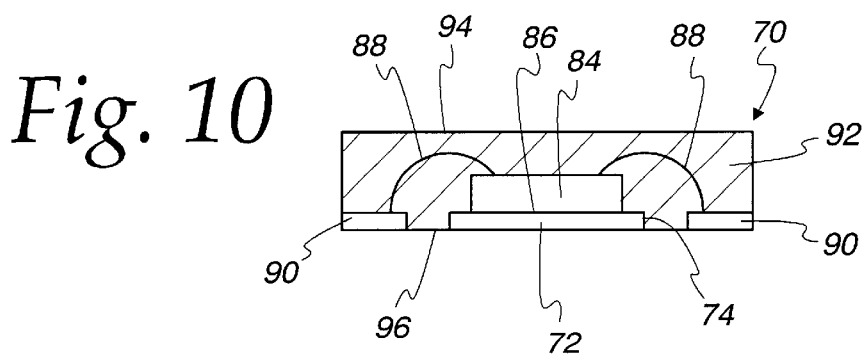

SEMICONDUCTOR DEVICE AND LEAD FRAME ASSEMBLY/LEAD FRAME FOR MAKING A SEMICONDUCTOR DEVICE

BACKGROUND OF THE INVENTION

1. Field of the Invention

This invention relates to semiconductor devices of the type having a support on which a semiconductor chip is mounted and a plurality of leads electrically connected to the semiconductor device and, more particularly, to a lead identifier which assists identification of a specific lead in the plurality of leads.

2. Background Art

Semiconductor devices are commonly constructed using lead frames, each consisting of a support and a plurality of leads spaced around the support. A semiconductor chip is mounted on one surface of the support. Conductive elements, such as wires, electrically connect between the support and the multiple leads. The semiconductor chip and wire leads are resin sealed. The support and leads are exposed at the bottom/back side of the completed semiconductor device and are not exposed at the top/front side of the completed semiconductor device.

It is helpful to the user of such semiconductor devices to be able to identify at least one specific lead in the plurality of leads. For this purpose, conventionally an identification mark has been placed on the top/front of the semiconductor device in a manner to assist identification of a specific lead or leads. Since the location of a specific lead or leads on the bottom of the semiconductor device is identified by the mark on the top of the semiconductor device, while working at the bottom side of the semiconductor device, it may be difficult to identify a specific lead or leads through the identification mark.

SUMMARY OF THE INVENTION

In one form, the invention is directed to a semiconductor device having oppositely facing first and second sides. The semiconductor device has a support exposed at the first side of the semiconductor device, a semiconductor device mounted on the support, and a plurality of leads connected to the semiconductor device. A lead identifier on the support is visible at the first side of the semiconductor device and assists identification of a specific lead in the plurality of leads.

In one form, the support has a peripheral edge and the lead identifier is at the peripheral edge.

The support has a thickness between the first and second sides. The lead identifier may be formed fully through the thickness of the support or only partially through the thickness of the support.

In one form, the support has a polygonal shape with a plurality of corners and the lead identifier is at one of the corners.

The lead identifier may be formed in the support by etching, stamping, or the like.

In one form, the semiconductor device has a tie bar projecting away from the support and the lead identifier extends from the support into a portion of the tie bar.

The invention is also directed to a lead frame assembly for a semiconductor device, which lead frame assembly has oppositely facing first and second sides. The lead frame assembly has a support having a surface on the first side of the lead frame assembly for mounting a semiconductor chip, a plurality of leads spaced from the support, and a tie bar network connecting the support to the plurality of leads. The lead frame assembly has a lead identifier at the second side of the lead frame assembly which assists identification of a specific lead in the plurality of leads.

The invention is further directed to a lead frame for a semiconductor device, which lead frame has oppositely facing first and second sides. The lead frame has a support having a surface on the first side of lead frame for mounting a semiconductor chip and a plurality of leads spaced from the support. The lead frame has a lead identifier at the second side of the lead frame which assists identification of a specific lead in the plurality of leads.

BRIEF DESCRIPTION OF THE DRAWINGS

FIG. 8 is a top view of another form of semiconductor device according to the present invention;

FIG. 9 is a bottom view of the semiconductor device of FIG. 8;

FIG. 10 is an enlarged, partial cross-sectional view of the semiconductor device taken along line 10—10 of FIG. 9;

DETAILED DESCRIPTION OF THE DRAWINGS

Figure 1:
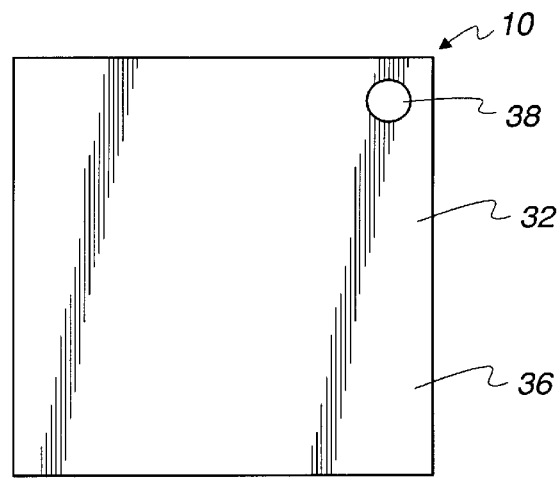
FIG. 1 view of a semiconductor device made according to the present invention.

In FIGS. 1–5, one form of a semiconductor device, according to the present invention, is shown at 10. The semiconductor device 10 consists of a flat, polygonally-shaped support 12 with a peripheral edge 14. Sixteen leads 16 are spaced around the peripheral edge 14 of the support 12. The support 12 has a generally squared shape with the peripheral edge 14 being defined by straight edge portions 18,20,22,24. Four leads 16 are spaced in similar fashion at each edge portion 18,20,22,24. The sixteen leads 16 are identified by numbers 1–16, consecutively, starting from the lead at the right end of the edge portion 22 in FIG. 2, continuing fully around the support 12.

A semiconductor chip 26 is mounted on a surface 28 of the support 12. Conductive elements, in this case wires 30, electrically connect between the semiconductor chip 26 and the leads 16.

The support 12, leads 16, semiconductor chip 26, and wires 30 are embedded in a resin sealing layer 32. With this arrangement, the support 12 and leads 16 are exposed at a bottom/back side 34 of the completed semiconductor device 10. The resin layer 32 defines the opposite, exposed, top/front side 36 of the semiconductor device 10.

An arbitrarily configured identification mark 38, in this case a round dot, is placed on the top/front side 36 of the semiconductor device 10 to assist the identification of specific lead in the plurality of leads 16.

Figure 2:
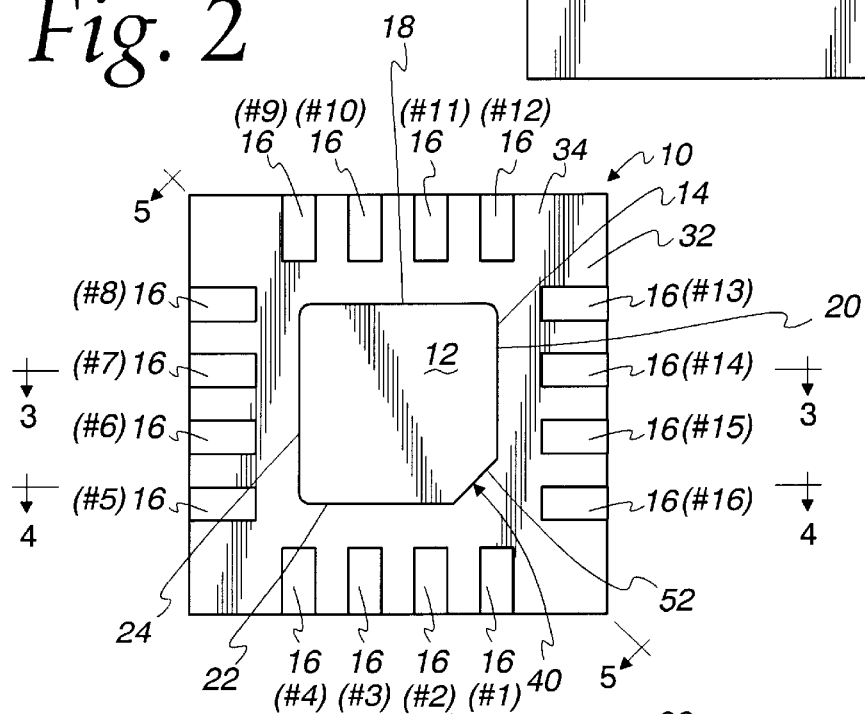
FIG. 2 is a bottom view of the semiconductor device in FIG. 1 and showing a lead identifier formed on a support on the semiconductor device.
Figure 3:
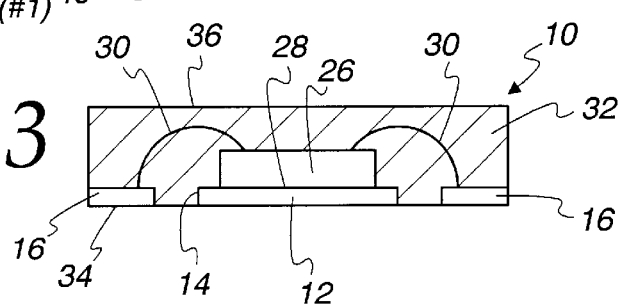
FIG. 3 is an enlarged, partial cross-sectional view of the semiconductor device taken along line 3—3 of FIG. 2.
Figure 4:
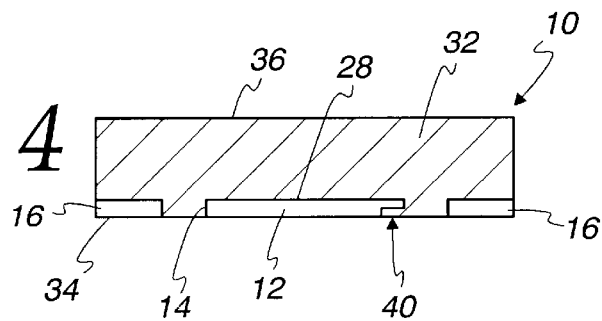
FIG. 4 is an enlarged, partial cross-sectional view of the semiconductor device taken along line 4—4 of FIG. 2.
Figure 5:
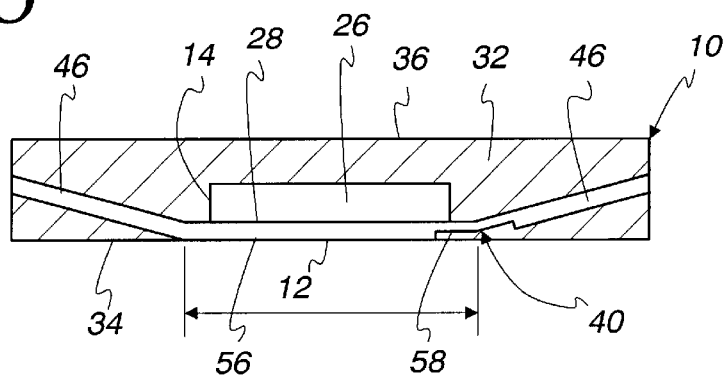
FIG. 5 is an enlarged, partial cross-sectional view of the semiconductor device taken along line 5—5 of FIG. 2.

In this particular embodiment, the specific lead to be identified is lead #1, as seen in FIG. 2. However, the identification mark 38 can identify any desired lead 16.

Figure 6:
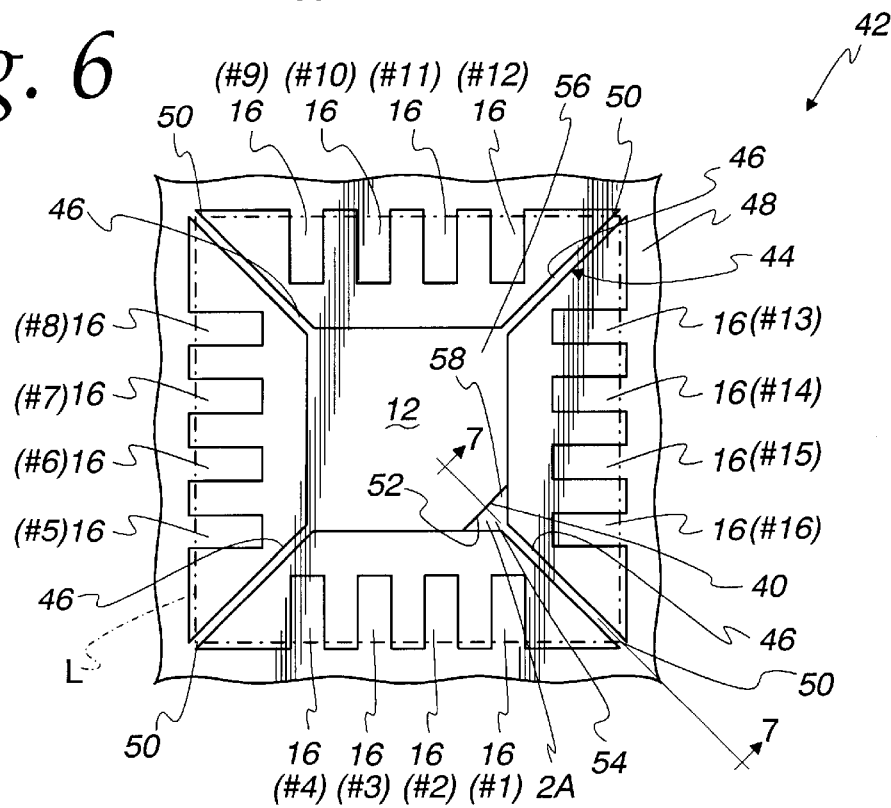
FIG. 6 is an enlarged, fragmentary, plan view of a lead frame assembly from which a lead frame is cut to be incorporated into the semiconductor device in FIGS. 1–5.
Figure 7:
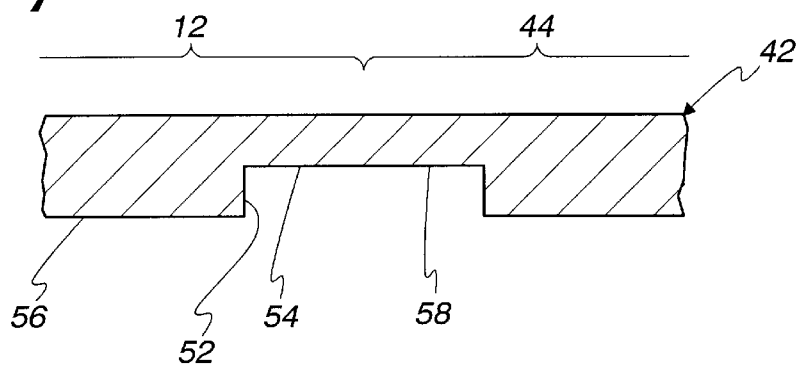
FIG. 7 is an enlarged, fragmentary, cross-sectional view of the lead frame assembly taken along line 7—7 of FIG. 6.
Figure 11:
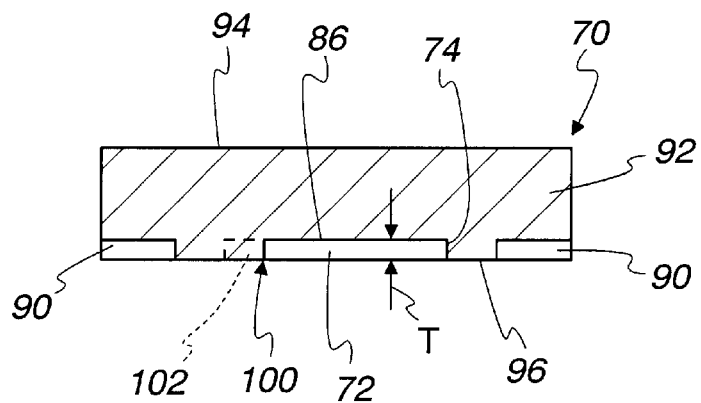
FIG. 11 is an enlarged, partial cross-sectional view of the semiconductor device taken along line 11—11 of FIG. 9.

To assist identification of a specific lead according to the invention, in this case lead #1 on the bottom side 34 of the semiconductor device 10, a lead identifier 40 is provided. To more clearly describe the lead identifier 40, reference is made to FIGS. 6 and 7, in conjunction with FIGS. 1–5, wherein a lead frame assembly 42 is shown, from which the support 12 and leads 16 are formed.

The lead frame assembly 42 consists of a tie bar network 44. The tie bar network 44 consists of four thin tie bars 46 projecting away from the corners of the support 12, and a thickened tie bar portion 48 which extends continuously around the support 12, connects to the ends 50 of the tie bars 46 remote from the support 12, and carries the leads 16, which project in cantilever fashion therefrom.

The lead identifier 40 in this particular embodiment is an angled edge 52 defined by a triangular surface 54 at one of the corners of the support adjacent to the lead identified as #1. The surface 54 is recessed from the bottom surface 56 of the support 12. This recessing may be effected by forming the support using a complementary mold, by etching, stamping, or pressing the support 12, or by any other means known to those skilled in the art. This recessed surface 54 continues into a portion of the tie bar 46 at the same corner of the support 12.

In forming the resin sealing layer 32, resin flows into a recess 58 defined by the recessed surface 54 so that the support 12 appears truncated at the corner where the lead identifier 40 is located. The tie bars 46 projecting from the corners, angle toward the top of the semiconductor device 10 so as to be substantially fully surrounded by the resin in the sealing layer 32. Accordingly, there is an uninterrupted resin layer formed between the edge 52 and the lead 16, identified as #1 at the bottom/back side 34.

The semiconductor device 10 is completed by cutting through the lead frame assembly 42 along the squared line L, corresponding to the shape and dimension of the completed semiconductor device 10, and through the resin sealing layer 32 in which the support 12, leads 16, semiconductor chip 26, and wires 30 are embedded. Alternatively, molds can be used to confine the resin and sealing layer 32 within a dimension corresponding to the completed shape of the semiconductor device 10. Thereafter, the lead frame, which is that part of the lead frame assembly 42 within the boundary of the line L, can be severed from the remainder of the lead frame assembly 42 without cutting through the resin sealing layer 32, or the entire thickness thereof.

A lead identifier 40 may be situated elsewhere on the support 12, and may be extended fully therethrough, to identify any one of the leads 16. In this particular embodiment, the user can identify the lead 16 identified as #1 by placing the lead identifier 40 at the twelve o'clock position, whereupon the lead 16 identified as #1 can be located by identifying the closest lead in a clockwise direction from the twelve o'clock position.

In FIGS. 8–11, another form of semiconductor device, according to the present invention, is shown at 70. The semiconductor device 70 is just one example of myriad different constructions that semiconductor devices may take, and into which the present invention can be incorporated. The semiconductor device 70 consists of a rectangular support 72 having a peripheral edge 74 with shorter edge portions 76,78 and longer edge portions 80,82. A semiconductor chip 84 is mounted on a surface 86 of the support 72. Wires 88 electrically connect between the semiconductor chip 84 and, in this embodiment, fourteen leads 90, which are identified as #1–14. Seven leads 90 are provided at each of the longer edge portions 80,82. The support 72, semiconductor chip 84, wires 88, and leads 90 are embedded in a resin sealing layer 92, which defines the exposed top/front surface 94 of the semiconductor device 70. The support 72 and leads 90 are exposed on the bottom/back surface 96 of the semiconductor device 70.

On the top/front surface 94 of the semiconductor chip 70, an identification mark 98 is provided and is strategically located to assist the identification of, in this case, the lead 90 identified as #1 from the top of the semiconductor device 70. The support 72 has a lead identifier 100 thereon corresponding to the lead identifier 40 on the semiconductor device 10. In this embodiment, the lead identifier 100 is defined by an angled edge 102, at the juncture of the peripheral edge portions 72,82. The angled edge 102 extends fully through the thickness T (FIG. 11) of the support 72. The lead identifier 100 is strategically located to assist the identification of a specific lead 90 amongst a plurality of leads 90, and in this case, the lead 90 identified as #1.

Figure 12:
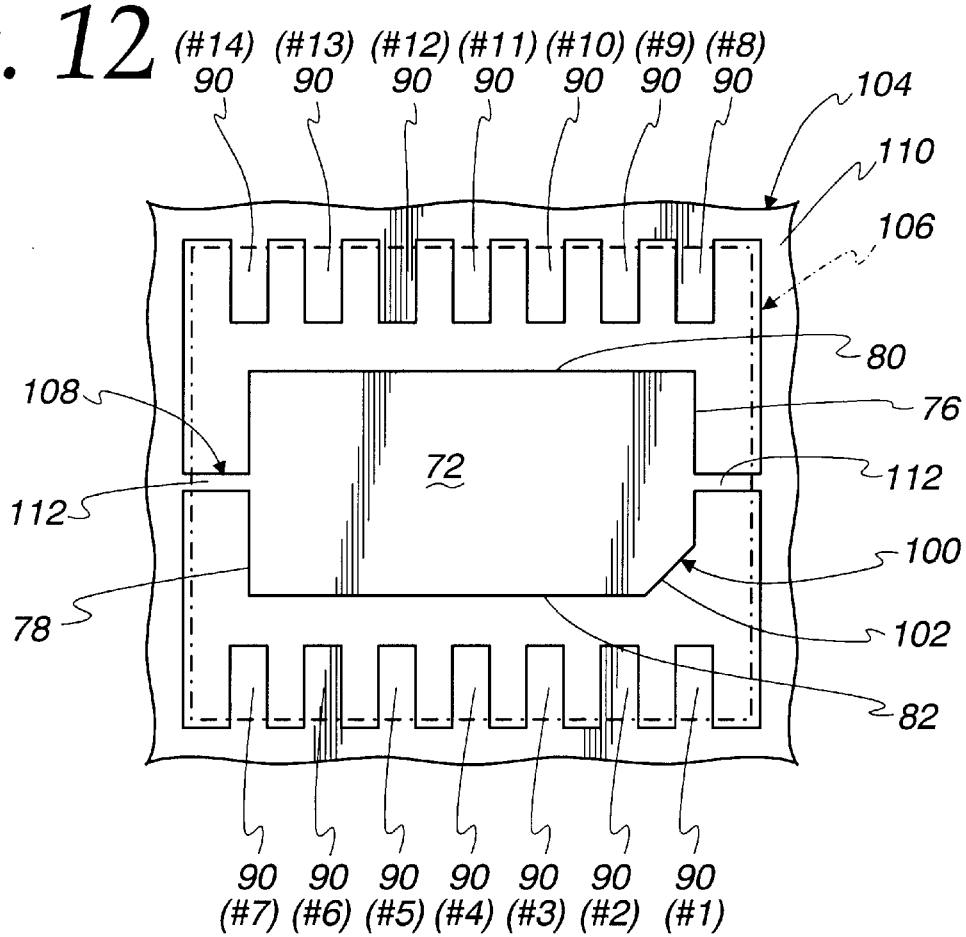
FIG. 12 is an enlarged, fragmentary, plan view of a lead frame assembly from which a lead frame is cut to be incorporated into the semiconductor device in FIGS. 8–11.

In FIG. 12, a lead frame assembly is shown at 104, from which the lead frame 106 is severed to define the aforementioned support 72 and leads 90. The lead frame assembly 104 includes a tie bar network 108 which connects between the support 72 and the leads 90. The tie bar network includes a thickened tie bar portion 110 which surrounds the lead frame 106 and tie bars 112 which project, one each, from the peripheral edge portions 76,78 to the tie bar portions 110. The tie bars 112 project from the support 72 at a location midway between the edge portions 80,82 so as to maintain the support 72 and leads 90 in the desired relative position yet allow enough space for the lead identifier 100 to be formed.

As in the prior embodiment, once the resin layer 92 is formed, the edge 102 remains visible on the bottom surface 96 of the semiconductor device 70 to assist identification of a specific lead 90, and in this case the lead 90 identified as #1. The edge 102 may be formed by any means known to those skilled in the art. For example, the lead frame assembly 104 may be formed in the configuration shown through a stamping operation.

It should be understood that the particular location and configuration of the lead identifier 40,100 can vary considerably from that shown. The edges 52,102, as shown in the described embodiments, are just exemplary in nature. The lead identifier 40,100 can be formed anywhere around the peripheral edge 14,74 of either support 12,72, or at a location within the peripheral edge 14,74, as by a discrete opening that extends partially or fully through the thickness of the support 12,72.

As another variation, three of the four corners of the supports 12,72 could be "truncated", whereas the non-truncated corner identifies the desired lead location.

While the invention has been described with particular reference to the drawings, it should be understood that various modifications could be made without departing from the spirit and scope of the present invention.

What is claimed is:

1. A semiconductor device having oppositely facing first and second sides, the semiconductor device comprising:
   a support exposed at the first side of the semiconductor device;
   a semiconductor element mounted on the support;
   a plurality of leads connected to the semiconductor device; and
   a lead identifier on the support and visible at the first side of the semiconductor device which assists identification of a specific lead in the plurality of leads.

2. The semiconductor device according to claim 1 wherein the support has a peripheral edge and the lead identifier is at the peripheral edge.

3. The semiconductor device according to claim 1 wherein the support has a thickness between the first and second sides and the lead identifier is formed fully through the thickness of the support.

4. The semiconductor device according to claim 1 wherein the support has a thickness between the first and second sides and the lead identifier is formed only partially through the thickness of the support.

5. A semiconductor device having oppositely facing first and second sides, the semiconductor device comprising:
   a support exposed at the first side of the semiconductor device;
   a semiconductor device mounted on the support;
   a plurality of leads connected to the semiconductor device; and
   a lead identifier on the support and visible at the first side of the semiconductor device which assists identification of a specific lead in the plurality of leads,
   wherein the support has a polygonal shape with a plurality of corners and the lead identifier is at one of the corners.

6. The semiconductor device according to claim 4 wherein the lead identifier is formed in the support by etching the support.

7. The semiconductor device according to claim 4 wherein the lead identifier is formed in the support by stamping the support.

8. A semiconductor device having oppositely facing first and second sides, the semiconductor device comprising:
   a support exposed at the first side of the semiconductor device;
   a semiconductor device mounted on the support;
   a plurality of leads connected to the semiconductor device; and
   a lead identifier on the support and visible at the first side of the semiconductor device which assists identification of a specific lead in the plurality of leads,
   wherein the semiconductor device comprises a tie bar projecting away from the support and the lead identifier extends from the support into a portion of the tie bar.

9. A lead frame assembly for a semiconductor device, the lead frame assembly having oppositely facing first and second sides and comprising:
   a support having a surface on the first side of the lead frame assembly for mounting a semiconductor chip;
   a plurality of leads spaced from the support;
   a tie bar network connecting the support to the plurality of leads; and
   a lead identifier on the support at the second side of the lead frame assembly which assists identification of a specific lead in the plurality of leads.

10. The lead frame assembly for a semiconductor device according to claim 9 wherein the support has a peripheral edge and the lead identifier is at the peripheral edge.

11. The lead frame assembly for a semiconductor device according to claim 9 wherein the support has a thickness between the first and second sides and the lead identifier is formed fully through the thickness of the support.

12. The lead frame assembly for a semiconductor device according to claim 9 wherein the support has a thickness between the first and second sides and the lead identifier is formed only partially through the thickness of the support.

13. A lead frame assembly for a semiconductor device, the lead frame assembly having oppositely facing first and second sides and comprising:
   a support having a surface on the first side of the lead frame assembly for mounting a semiconductor chip;
   a plurality of leads spaced from the support; and
   a tie bar network connecting the support to the plurality of leads,
   the lead frame assembly having a lead identifier at the second side of the lead frame assembly which assists identification of a specific lead in the plurality of leads,
   wherein the support has a polygonal shape with a plurality of corners and the lead identifier is at one of the corners.

14. The lead frame assembly for a semiconductor device according to claim 12 wherein the lead identifier is formed in the support by etching the support.

15. The lead frame assembly for a semiconductor device according to claim 12 wherein the lead identifier is formed in the support by stamping the support.

16. A lead frame for a semiconductor device, the lead frame having oppositely facing first and second sides and comprising:
   a support having a surface on the first side of the lead frame for mounting a semiconductor chip;
   a plurality of leads spaced from the support; and
   a lead identifier on the support at the second side of the lead frame which assists identification of a specific lead in the plurality of leads.

17. The lead frame assembly for a semiconductor device according to claim 16 wherein the support has a peripheral edge and the lead identifier is at the peripheral edge.

18. The lead frame assembly for a semiconductor device according to claim 16 wherein the support has a thickness between the first and second sides and the lead identifier is formed fully through the thickness of the support.

19. The lead frame assembly for a semiconductor device according to claim 16 wherein the support has a thickness between the first and second sides and the lead identifier is formed only partially through the thickness of the support.

20. A lead frame for a semiconductor device, the lead frame having oppositely facing first and second sides and comprising:
   a support having a surface on the first side of the lead frame for mounting a semiconductor chip; and
   a plurality of leads spaced from the support,
   the lead frame having a lead identifier at the second side of the lead frame which assists identification of a specific lead in the plurality of leads,
   wherein the support has a polygonal shape with a plurality of corners and the lead identifier is at one of the corners.

21. The lead frame assembly for a semiconductor device according to claim 19 wherein the lead identifier is formed in the support by etching the support.

22. The lead frame assembly for a semiconductor device according to claim 19 wherein the lead identifier is formed in the support by stamping the support.

* * * * *